(12) United States Patent
Vinke et al.

(10) Patent No.: US 7,152,194 B2
(45) Date of Patent: Dec. 19, 2006

(54) METHOD AND CIRCUIT FOR SCAN TESTING LATCH BASED RANDOM ACCESS MEMORY

(75) Inventors: David Vinke, Clackamas, OR (US); Ekambaram Balaji, Portland, OR (US); Giuseppe Fornaciari, Milan (IT)

(73) Assignee: LSI Logic Corporation, Milpitas, CA (US)

( * ) Notice: Subject to any disclaimer, the term of this patent is extended or adjusted under 35 U.S.C. 154(b) by 434 days.

(21) Appl. No.: 10/645,900

(22) Filed: Aug. 20, 2003

(65) Prior Publication Data

US 2005/0041460 A1    Feb. 24, 2005

(51) Int. Cl.
*G01R 31/317* (2006.01)
*G01R 31/316* (2006.01)
(52) U.S. Cl. .................... 714/726; 714/724
(58) Field of Classification Search ............... 714/726, 714/738, 724; 326/16, 37
See application file for complete search history.

(56) References Cited

U.S. PATENT DOCUMENTS

| | | | | |
|---|---|---|---|---|
| 4,819,166 A * | 4/1989 | Si et al. | ................ | 714/30 |
| 5,123,101 A * | 6/1992 | Sindhu | ................ | 711/207 |
| 5,909,451 A * | 6/1999 | Lach et al. | ................ | 714/726 |
| 6,023,439 A * | 2/2000 | Cliff et al. | ................ | 365/230.03 |
| 6,341,092 B1 * | 1/2002 | Agrawal | ................ | 365/201 |
| 6,442,092 B1 * | 8/2002 | Tomita | ................ | 365/219 |
| 6,698,005 B1 * | 2/2004 | Lindkvist | ................ | 716/6 |

* cited by examiner

*Primary Examiner*—Albert Decady
*Assistant Examiner*—Dipakkumar Gandhi
(74) *Attorney, Agent, or Firm*—Eric James Whitesell (57) ABSTRACT

A latch based random access memory includes an input data register; an input data buffer coupled to the input data register; a latch array coupled to the input data buffer; and a latch array bypass multiplexer for selecting one of the input data buffer and the latch array in response to a memory scan mode signal to generate a first data output of the latch based random access memory from the input data buffer during logic scan testing and a second data output of the latch based random access memory from the latch array during memory scan testing.

13 Claims, 5 Drawing Sheets

Step 1:
```
for i = 0, i < r, i++
        if (i is even)
                Wi(AAAA)
        else
                Wi(5555)
        end
end
```

Step 2:
```
R0(AAAA)
for i = 1, i < r, i++
        if (i is even)
                Ri(AAAA)
                Wi-1(AAAA)
        else
                Ri(5555)
                Wi-1(5555)
        end
end
if (r is even)
        Wr-1(AAAA)
else
        Wr-1(5555)
end
```

Step 3:
```
if (r is even)
        Rr-1(AAAA)
else
        Rr-1(5555)
end
for i = r-1, i > 0, i--
        if (i is even)
                Ri-1(AAAA)
                Wi(0000)
        else
                Ri-1(5555)
                Wi(FFFF)
        end
end
W0(0000)
```

Step 4:
```
DIB0 = FFFF
for i = 1, i < r, i++
        if (i is even)
                DIBi = FFFF
                Ri-1(FFFF)
        else
                DIBi = 0000
                Ri-1(0000)
        end
end
if (r is even)
        Rr-1(FFFF)
else
        Rr-1(0000)
end
```

METHOD AND CIRCUIT FOR SCAN TESTING LATCH BASED RANDOM ACCESS MEMORY

BACKGROUND OF THE INVENTION

1. Field of the Invention

The present invention relates generally to the design and testing of memory arrays for integrated circuits. More specifically, but without limitation thereto, the present invention relates to the design and testing of latch based random access memory (LBRAM) in an application-specific integrated circuit (ASIC).

2. Description of Related Art

The use of memory arrays in application-specific integrated circuits (ASICs) is increasing, and it is estimated that memory arrays will constitute 94 percent of the die area in the average application-specific integrated circuit by the year 2014. There is also an increase in the use of small memories, typically implemented as latch based random access memory (LBRAM). A typical application-specific integrated circuit design uses over 400 latch based random access memory arrays. A key issue with the use of such a large number of memory arrays is how to test the memory arrays for manufacturing defects without increasing the die area by an excessive amount.

Application-specific integrated circuits (ASICs) are susceptible to manufacturing defects that may cause the ASIC to malfunction, called faults. To determine whether an ASIC has faults, the ASIC is typically tested using automated test equipment (ATE) to detect and reject defective parts before shipment to a customer. The number of faults that may be detected by ATE using a test devised by the manufacturer is typically expressed as a percentage of the total number of possible faults and is called the fault coverage of the test. A high value of fault coverage is desirable to avoid the costs associated with delivering defective parts.

SUMMARY OF THE INVENTION

In one aspect of the present invention, a latch based random access memory includes an input data register; an input data buffer coupled to the input data register; a latch array coupled to the input data buffer; and a latch array bypass multiplexer for selecting one of the input data buffer and the latch array in response to a memory scan mode signal to generate a first data output of the latch based random access memory from the input data buffer during logic scan testing and a second data output of the latch based random access memory from the latch array during memory scan testing.

In another aspect of the present invention, a method of scan testing a latch based random access memory in an integrated circuit die comprising steps of:

(a) modifying a latch based memory to include a latch array bypass multiplexer for selecting one of an output of an input data buffer of the latch based random access memory and an output of a latch array of the latch based random access memory for generating a first data output of the latch based random access memory from the input data buffer during logic scan testing and a second data output of the latch based random access memory from the latch array during memory scan testing in response to a memory scan mode signal;

(b) asserting the memory scan mode signal during a memory scan test; and (c) removing the memory scan mode signal during a logic scan test.

BRIEF DESCRIPTION OF THE DRAWINGS

The present invention is illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

To facilitate testing of ASICs using automated test equipment (ATE), test logic is generally included in the ASIC circuit itself. The test logic usually functions only during testing and has no utility during normal operation of the ASIC in the field. Nevertheless, the test logic consumes additional die area in the ASIC, which results in fewer die manufactured on each wafer. The reduced wafer yield results in increased production costs. The automated test equipment is also expensive, consequently the testing time required for each ASIC further increases production costs.

As the use of latch based memory arrays in ASICs increases, there is an increased probability that faults will occur, necessitating more test logic. However, the added test logic for the memory arrays further increases the die area, disadvantageously reducing the wafer yield. Also, the additional testing required for more memory arrays increases the test time. To maintain high fault coverage without excessively increasing costs, it is desirable to minimize the amount of test logic and the time required for test. A number of methods currently exist for testing latch based memory arrays.

In the built-in self-test (BIST) method, special test logic circuits are included in the ASIC design. The BIST logic generates a set of test patterns to test the memory, writes the test patterns into the memory, reads the memory, and compares the memory outputs with the test patterns to detect faulty memory locations. Most of the testing is controlled by the BIST logic, and the automated test equipment (ATE) simply signals the BIST to start the test and then reads the fault information generated by the BIST. Disadvantageously, BIST adds far too much die area compared to the size of LBRAM, as much as 100 percent for small configurations. The resulting die size can become so large that the ASIC is no longer cost effective to manufacture.

In the scan method, all the flip-flop elements in the ASIC design are connected in scan chains. During scan test, test patterns are shifted through the scan chains to initialize the flip-flop elements to a predetermined state. The output data from the logic elements connected to the flip-flop elements is captured by other flip-flop elements that are also part of the scan chains. The captured data is then shifted out. The ATE controls the shifting and capture phases and transmits the test patterns to the ASIC. The ATE also receives the captured data when it is shifted out and compares the captured data to expected results. Scan testing may be used with latch based memory arrays by including scannable latches in the memory arrays and including the scannable latches in scan chains. Test patterns may then be scanned into the memory arrays in the same manner as for other flip-flop elements in the ASIC design. This method provides high fault coverage, however, using scannable latches inside the LBRAM significantly increases the die area of each LBRAM, because scannable latches require more logic gates than non-scannable latches.

For some ASIC designs, the total number of flip-flop elements, or latches, used in a large number of small LBRAM arrays may be in the millions. Because each latch is included in the scan chains, the scan chains may be extremely long. Because each test pattern must be serially scanned through the scan chains, long scan chains imply correspondingly high testing times required to test the LBRAM arrays. The testing time may be so large that the ASIC is no longer cost effective to manufacture.

In the scan collar method, flip-flops in the scan chains apply input data to the latch based memory and monitor the data output from the latch based memory. This avoids having to include latches in the scan chains. Previous LBRAM designs do not include flip-flops for scanning test patterns, however, flip-flops may be added around the LBRAM to control the LBRAM inputs and read the LBRAM outputs. These added flip-flops are called a scan collar.

During scan test, test patterns for the logic portion of the ASIC design, that is, the portion that does not include the latch based memory arrays, are typically generated randomly by a process called automatic test pattern generation (ATPG). The test patterns provided by automatic test pattern generation do not provide high fault coverage for latch based memory arrays. However, test pattern generators for small memory arrays are available, for example, MacroTest from Mentor Graphics, that generate deterministic test vectors. A scan test collar may be added to each LBRAM and driven by such a test pattern generator to provide excellent fault coverage. The scan test collar also increases the die area overhead and the production cost of the ASIC, although not as severely as the BIST method. Furthermore, most of the flip-flops in the ASIC design are included in the scan chains, even during the LBRAM test, resulting in long scan test chains and testing time.

MacroTest also has the capability to trace through logic connected to small memory arrays to find flip-flops that may be used to write to the memory inputs and read from the memory outputs. This capability requires no additions or changes to the internal structure of the LBRAM, however, the trace through the ASIC design to find flip-flops that may be used to write to the LBRAM inputs and read from the LBRAM outputs is not always successful, especially in ASIC designs using multiple LBRAM arrays. In these instances, the ASIC manufacturer must accept reduced fault coverage or rework the design to add scannable flip-flops. The former implies higher failure rates, while the latter creates undesirable complexity to the design flow. Also, most of the flip-flops in the ASIC design must be included in the scan chains, resulting in long testing times to test LBRAM arrays.

In one aspect of the present invention, a latch based random access memory includes an input data register; an input data buffer coupled to the input data register; a latch array coupled to the input data buffer; and a latch array bypass multiplexer coupled to the input data buffer and the latch array for selecting one of the input data buffer and the latch array in response to a memory scan mode signal to generate a first data output of the latch based random access memory from the input data buffer during logic scan testing and a second data output of the latch based random access memory from the latch array during memory scan testing. Other embodiments further include a read address register; a read address multiplexer coupled to the read address register for selecting one of a logic scan address and a memory scan address in response to a memory scan mode signal; a write enable register; a clock signal multiplexer coupled to the read address register and the write enable register for selecting one of a scan test clock signal and an application specific clock signal; a lockup latch coupled to the read address register for providing a minimum hold time for decoding a write signal; a lockup latch coupled to the input data register for providing a minimum hold time for a scan output signal; and bypass logic for coupling to the memory scan mode signal and the scan mode signal for controlling the latch array bypass multiplexer.

Figure 1:
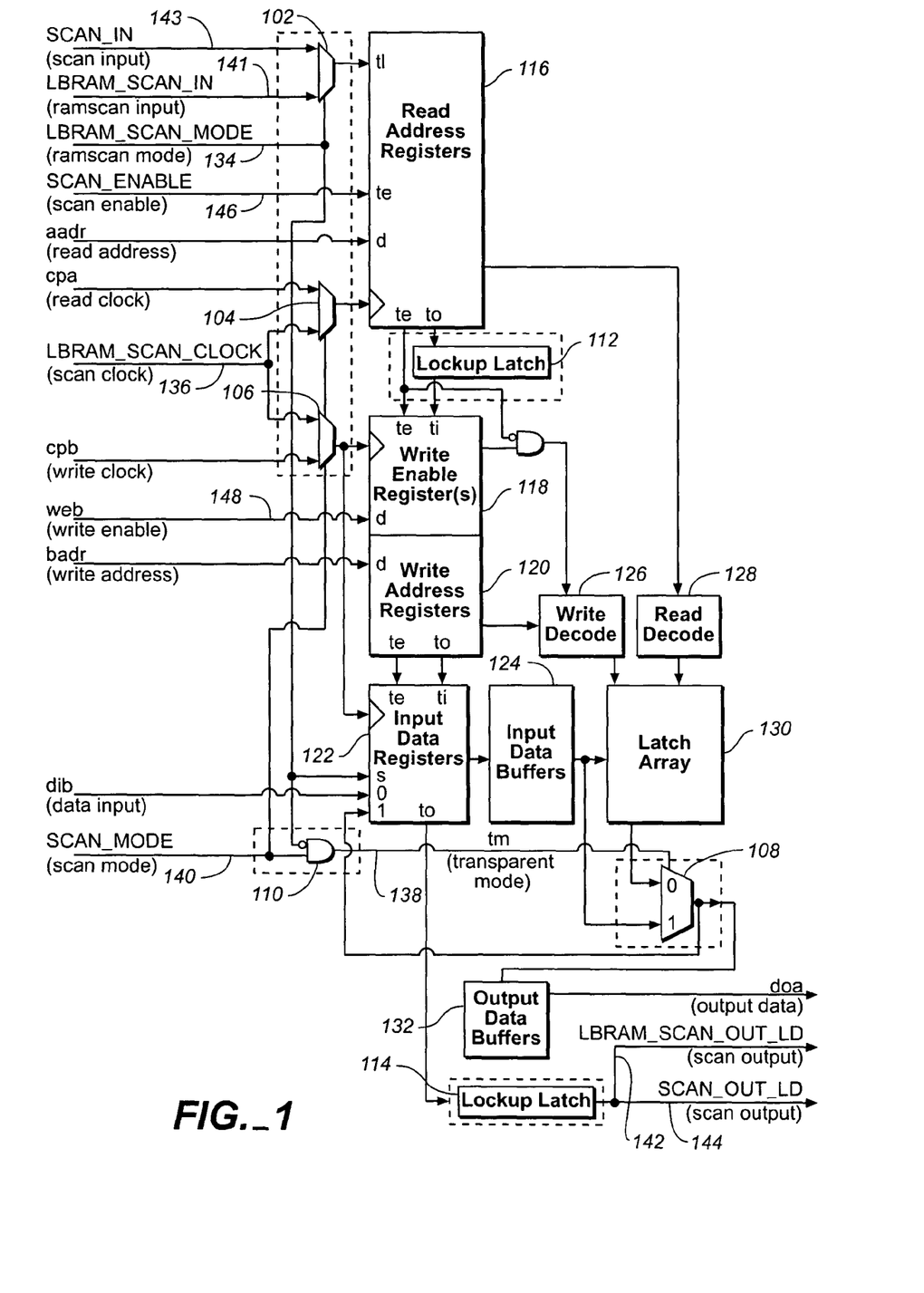
FIG. 1 illustrates a modified LBRAM according to an embodiment of the present invention.

FIG. 1 illustrates a modified LBRAM 100 according to an embodiment of the present invention. Shown in FIG. 1 are a scan input multiplexer 102, clock multiplexers 104 and 106, a latch array bypass multiplexer 108, bypass logic 110, lock-up latches 112 and 114, a read address register 116, a write enable register 118, a write address register 120, an input data register 122, an input data buffer 124, a write address decoder 126, a read address decoder 128, a latch array 130, an output data buffer 132, a memory scan mode signal 134, a LBRAM scan clock signal 136, a bypass logic signal 138, a scan mode signal 140, an LBRAM test scan chain input 141, an LBRAM scan output signal 142, a logic test scan chain input 143, a logic scan output signal 144, a scan enable signal 146, and a write enable 148.

In FIG. 1, the modified latch based RAM 100 includes the scan input multiplexer 102, the clock multiplexers 104 and 106, the latch array bypass multiplexer 108, the bypass logic 110, and the lock-up latches 112 and 114, which are enclosed by dashed lines to distinguish these components from the standard, well-known components of an LBRAM. The standard components of an LBRAM are the read address register 116, the write enable register 118, the write address register 120, the input data register 122, the input data buffer 124, the write address decoder 126, the read address decoder 128, the latch array 130, and the output data buffers 132.

The scan input multiplexer 102 connects the test input of the read address register 116 to the LBRAM test scan chain 141 or to the logic test scan chain 143 in response to the memory scan mode signal 134. The memory scan mode signal 134 is asserted on a test pin of the integrated circuit die incorporating the modified LBRAM 100 during scan testing according to well-known techniques.

The clock multiplexers 104 and 106 connect the read clock and the write clock inputs respectively of the modified latch based RAM 100 to either the read and write clocks generated by the application or to the LBRAM scan clock signal 136 in response to the scan mode signal 140. The clock multiplexers 104 and 106 allow all the flip-flops in the LBRAM test scan chain to be controlled by the LBRAM scan clock signal 136 during scan testing.

The latch array bypass multiplexer 108 allows the LBRAM data output buffer 132 to be connected to either the latch array 130 during application-specific operation, that is, the design function of the integrated circuit die, or directly to the input data register 122 in response to the bypass logic signal 138, thereby bypassing the latch array 130 during logic scan testing.

The bypass logic 110 generates the bypass logic signal 138 in response to the LBRAM scan mode signal 134 and the scan mode signal 140. The bypass logic signal 138 controls the latch array bypass multiplexer 108 during application-specific operation, LBRAM scan test, and logic scan test. The LBRAM scan mode signal 134 is typically generated by an on-chip test module called a test access port (TAP) module.

The lock-up latches 112 and 114 may be included to provide a minimum hold time for write enable register 118 to avoid hold timing violations between flip-flops in the scan chains that are connected to a clock tree (not shown) at different points. Depending on the manufacturing process technology and the flip-flop design, the lock-up latches 112 and 114 may not be necessary.

The LBRAM test scan output signal 142 and the logic test scan output signal 144 are logically identical, but have separate names to facilitate connections by an automated failure analysis scan test tool according to well-known techniques. The failure analysis scan test tool performs test logic generation and insertion and test pattern generation and verification. The failure analysis scan test tool also stitches all scan chains together and routes test connections at the chip level, including connections to a test access ports (TAP) module that controls internal test signals during all test modes. The TAP module is automatically generated according to well-known techniques.

The test patterns may be generated according to well-known techniques so that there is no need for any extra test logic such as built-in self-test logic (BIST) or an external test collar, thereby significantly reducing the die area required for the integrated circuit design. While it may be possible to use test programs to generate test patterns for LBRAM without adding an external test collar, there may be some instances where the LBRAM inputs cannot be controlled. This is most likely to occur when there are several LBRAMs that have to be tested concurrently. Advantageously, the modified latch based RAM 100 described above uses the internal LBRAM to ensure that each LBRAM can receive the test patterns, and the test runtime is significantly less than would be the case if no external test collar were used.

During the LBRAM test, the LBRAM address and data inputs are directly controlled by scanning in the test values directly into the read address register 116, the write address register 120, and the input data register 122. The read address register 116, the write address register 120, and the input data register 122 constitute LBRAM scan subchains. The LBRAM scan subchains of all the LBRAMs are concatenated into several scan chains by the failure analysis scan test tool according to well-known techniques.

An important feature of the present invention is that for the LBRAM scan test, the scan chains include only LBRAM scan chains. This feature reduces the length of the scan chains and the corresponding test time required on the automatic test equipment (ATE). ATE time is extremely expensive and may contribute a substantial portion of the cost of integrated circuit production.

Another important feature of the present invention is that the data output of the LBRAMs during the LBRAM scan test may be observed in the LBRAM scan subchain by using the input data register to capture the test data, thereby avoiding the need for an output data register.

Testing of the logic surrounding the LBRAMs may be performed by including the LBRAM scan chains in the logic test scan chains as follows.

Figure 2:
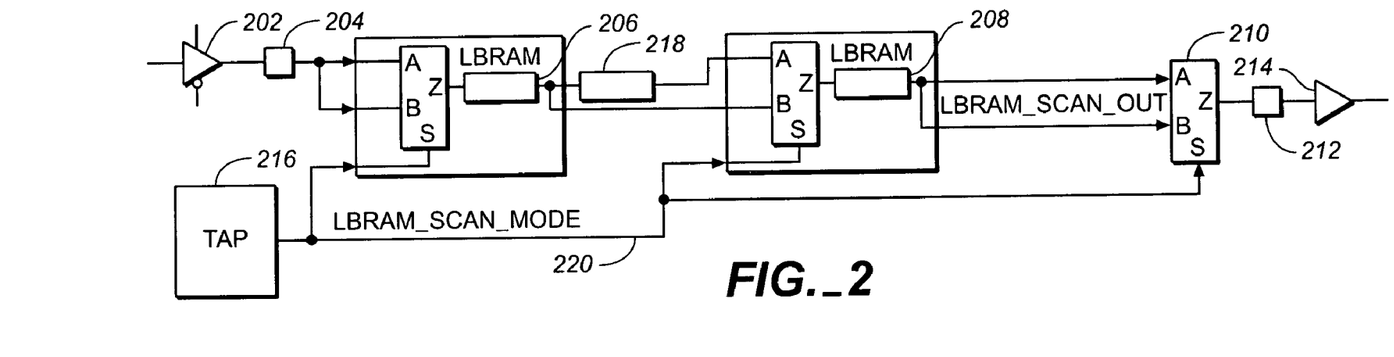
FIG. 2 illustrates a scan chain with a logic chain external to the modified LBRAM of FIG. 1.

FIG. 2 illustrates a scan chain with a logic chain external to the modified LBRAM 100 of FIG. 1. Shown in FIG. 2 are an input buffer 202, an input bscan cell 204, LBRAM subchains 206 and 208, a scan test output multiplexer 210, an output bscan cell 212, an output buffer 214, a test access port (TAP) module 216, a logic scan chain 218, and an LBRAM scan mode signal 220.

In FIG. 2, the logic scan chain 218 is tested by including the LBRAM subchains 206 and 208 in the logic scan test. During the logic scan test, the logic scan chain 218 is selected by the scan input multiplexer 102 in the LBRAM subchain 208, and the LBRAM latch arrays 130 are bypassed by the latch array bypass multiplexers 108 in FIG. 1 in response to the LBRAM scan mode signal 220, advantageously ensuring 100 percent fault coverage of the logic scan chain and reducing test time. During the LBRAM scan test, the logic scan chain 218 is bypassed by the scan input multiplexer 102 in the LBRAM subchain 208, and the LBRAM latch arrays 130 are selected by the latch array bypass multiplexer 108 in response to the LBRAM scan mode signal 220, advantageously reducing the testing time of the LBRAM latch arrays 130.

Figure 3:
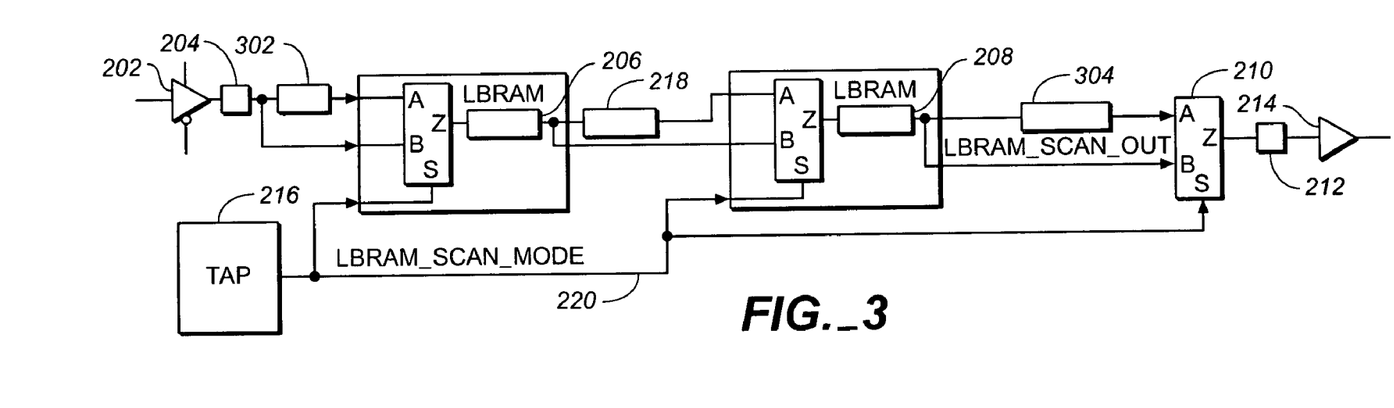
FIG. 3 illustrates a scan chain with multiple logic scan chains external to the modified LBRAM of FIG. 1.

FIG. 3 illustrates a scan chain diagram with multiple logic scan chains external to the modified LBRAM 100 of FIG. 1. Shown in FIG. 3 are an input buffer 202, an input bscan cell 204, LBRAM subchains 206 and 208, a scan test output multiplexer 210, an output bscan cell 212, an output buffer 214, a test access port (TAP) module 216, a logic scan chain 218, an LBRAM scan mode signal 220, and logic scan chains 302 and 304.

In FIG. 3, the logic scans chain 302 and 304 are tested by including the LBRAM subchains 206 and 208 in the logic scan test. During the logic scan test, the logic scan chains 302 and 304 are selected by the scan input multiplexers 102 in the LBRAM subchains 206 and 208, and the LBRAM latch arrays 130 are bypassed by the latch array bypass multiplexers 108 in FIG. 1 in response to the LBRAM scan mode signal 220. During the LBRAM scan test, the logic scan chains 302 and 304 are bypassed by the scan input multiplexers 102 in the LBRAM subchains 206 and 208, and the LBRAM latch arrays 130 are selected by the latch array bypass multiplexers 108 in response to the LBRAM scan mode signal 220. Again, there is no loss of test coverage in the external logic scan chains 302 and 304, and the testing time is advantageously reduced as described above.

In FIGS. 2 and 3, the scan chains extend from one external chip pin, the input pin, to another chip pin, the output pin. The input pin connects to the I/O buffer 202 that is followed by the bscan cell 204. The bscan cell 202 is a special cell used to implement boundary scan chains that connect all the I/O cells together. The boundary scan chains bypass all of the internal logic of the integrated circuit die and are used during system testing to test board level connections when the die is attached to a board. From the input bscan cell 202, the scan chains are split into an LBRAM scan chain and a logic scan chain as illustrated in FIGS. 2 and 3. The two chains are recombined by the scan input multiplexer 102 in each LBRAM so that they share the same subchain inside each LBRAM.

The LBRAM scan chain connects directly from the input bscan cell 204 to the first LBRAM, and then from the first LBRAM to the next LBRAM, and so on through all the LBRAMs. The logic scan chains connect the LBRAMS as well as the scan subchains for the surrounding logic on the die. The logic scan chains and the LBRAM scan chains are recombined finally by the scan test output mux 210 that is added automatically by the failure analysis scan test tool. The scan chains are connected to the output bscan cell 212 and the output buffer 214 and finally to the output pin.

In the example of FIG. 2, there is no scan subchain in the logic scan chain between the input pin and the first LBRAM or between the last LBRAM and the output pin. In the example of FIG. 3, scan subchains are connected between the between the input pin and the first LBRAM and between the last LBRAM and the output pin. In both FIGS. 2 and 3, the test access port (TAP) module 216 generates the LBRAM scan mode signal 220 to the input multiplexers 102, to the latch array bypass multiplexers 108 in the LBRAMs 100, and to the scan test output mux 210 added by the failure analysis scan test tool. The LBRAM scan mode signal 220 ensures that the LBRAM scan chains are selected and that the logic subchains are bypassed during the LBRAM scan test. During the logic scan test, the LBRAM scan mode signal 220 ensures that the logic subchains and the LBRAM scan subchains are selected while the LBRAM latch arrays are bypassed.

An important aspect of the present invention is that instead of testing all the logic functions of the die in one scan test, the scan test is partitioned into a logic scan test and a memory scan test to reduce the total test time required of the automated test equipment (ATE) and to ensure complete fault coverage of both the LBRAMs and the surrounding logic in the integrated circuit die. Alternatively, the scan test may be implemented without separating the LBRAM scan subchains from the logic scan chain in various embodiments of the present invention within the scope of the appended claims, and a separate output data register may be added to each LBRAM instead of reusing the input data register.

During the LBRAM scan test, a test pattern is scanned into the LBRAM input data registers 122 through the LBRAM scan chain. After the test pattern is scanned in, the scan enable signal 146 is removed to prevent shifting along the scan chain, and the scan clock signal 136 is cycled. If the test pattern has asserted the write enable 148, then the data in the input data register 122 is written into the latch array 130 at the address specified in the write address register 120. The latch array bypass multiplexer 108 selects the data from the latch array 130 so that the data is captured by the input data register 122 of the LBRAM. After the data is captured by the input data register 122 of the LBRAM, the scan enable 146 signal is asserted again to continue scanning the test data through the LBRAM scan chain.

During the logic scan test, a test pattern is scanned into the LBRAM read address registers 116, the LBRAM write address registers 120, and the input data registers 122 through the logic scan chain. The latch array bypass multiplexer 108 selects the output of the input data register 122, bypassing the latch array 130, so that the surrounding logic subchains connected to the LBRAM output data buffers 132 are controlled by the values in the input data registers 122. After the test pattern is scanned in, the scan enable signal 146 is removed to prevent shifting along the scan chain. The scan clock signal 136 is cycled to allow the logic states of the surrounding logic connected to the LBRAM inputs to be captured by the LBRAM read address registers 116, the LBRAM write address registers 120, and the input data registers 122. After the data is captured by the LBRAM read address registers 116, the LBRAM write address registers 120, and the input data registers 122, the scan enable signal 136 is asserted again to continue scanning the test data through the logic scan chain.

Figure 4:
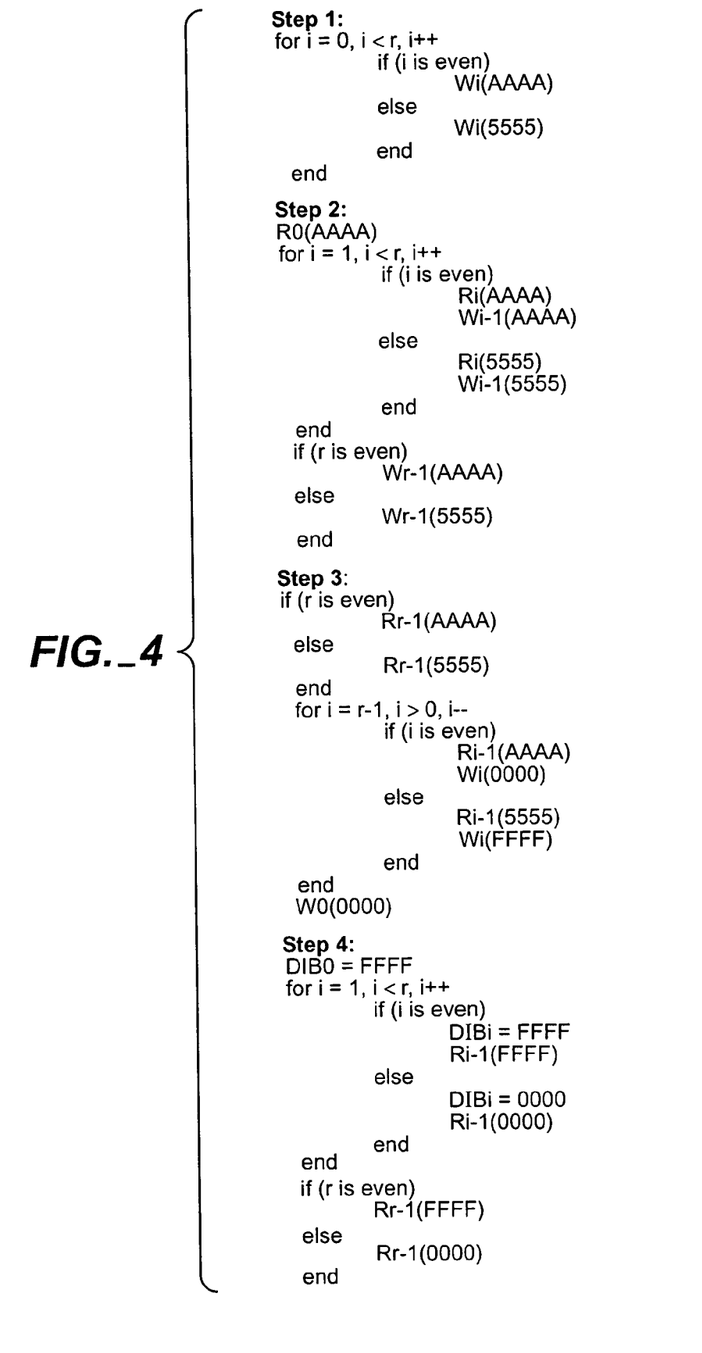
FIG. 4 illustrates an example of a march algorithm used to generate a test pattern for the LBRAM of FIG. 1.

FIG. 4 illustrates an example of a march algorithm used to generate a test pattern for the LBRAM 100 of FIG. 1.

Step 1 of the march algorithm initializes the LBRAM by writing the data words AAAA and 5555 into alternating latch array locations.

Step 2 of the march algorithm checks the stored data.

Step 3 of the march algorithm checks the stored data in reverse address order to fully test the address decoder and writes the data words 0000 and FFFF into alternating latch array locations.

Step 4 of the march algorithm checks for a stuck "1" on the write enable.

The algorithm of FIG. 4 provides 100 percent stuck at fault coverage and 100 percent coverage of bridging faults between adjacent bits, including all eight neighbors in the horizontal, vertical, and diagonal directions. The total number of test patterns is 4*r+3, where r is the number of words in the latch array 130.

Figure 5:
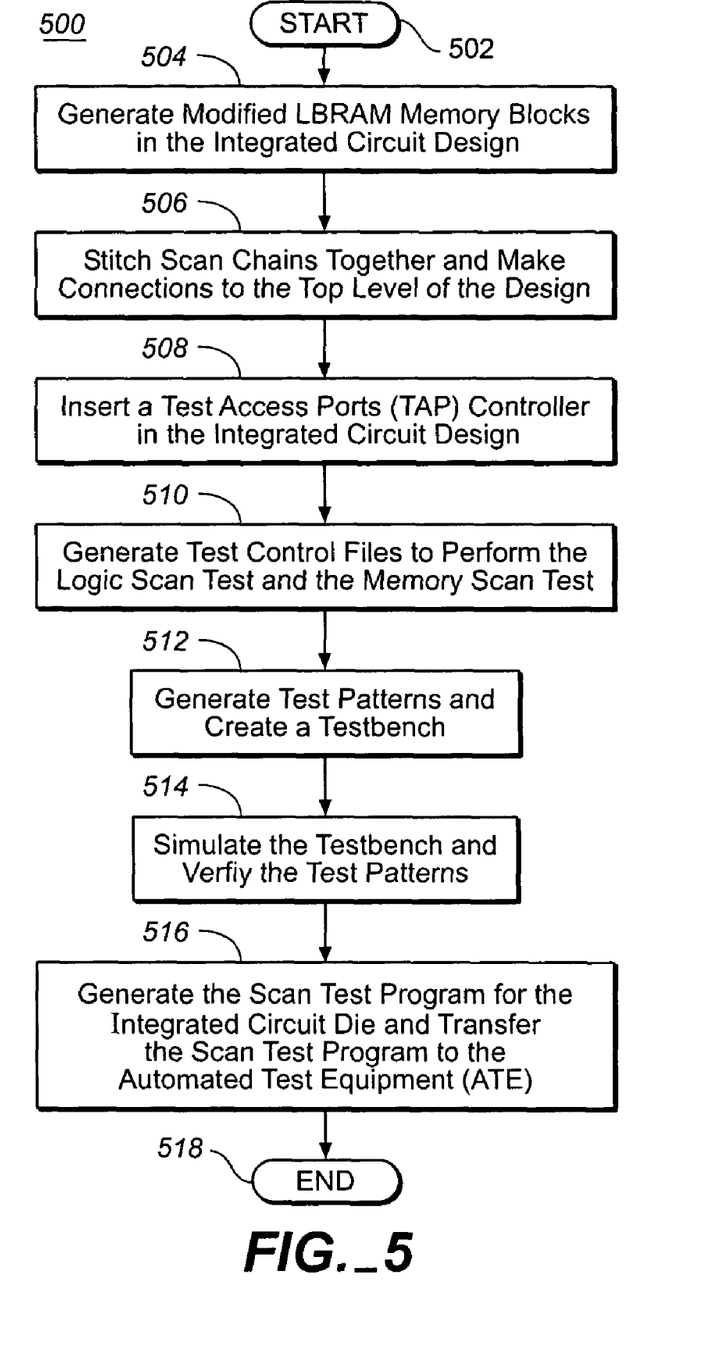
FIG. 5 illustrates a flow chart of a method of incorporating a scan test of the modified LBRAM of FIG. 1 in an integrated circuit design flow.

FIG. 5 illustrates a flow chart 500 of a method of incorporating a scan test of the modified LBRAM 100 of FIG. 1 in an integrated circuit design flow.

Step 502 is the entry point of the flow chart 500.

In step 504, the modified LBRAM memory blocks are generated in the integrated circuit design. This step includes the modifications to the LBRAM 100 illustrated in FIG. 1 and described above.

In step 506, the scan chains are stitched together as illustrated in FIGS. 2 and 3, and connections are made to the top level of the design.

In step 508, a test access ports (TAP) controller is inserted in the integrated circuit design according to well-known techniques.

In step 510, test control files are generated to perform the logic scan test and the memory scan test as described above.

In step 512, the test patterns are generated and a testbench is created.

In step 514, the testbench is simulated and the test patterns are verified.

In step 516, the scan test program for the integrated circuit die is generated and transferred to the automated test equipment (ATE).

Step 518 is the exit point of the flow chart 500.

After the test program has been transferred to the automated test equipment and is used to test fabricated dies, a failure analysis may be performed to determine which latches are failing in the LBRAM latch arrays. The failure analysis information may then be used to correct problems in manufacturing and to decrease the failure rate.

Other important aspects of the present invention include the use of the internal registers in the LBRAM in the scan chain instead of creating additional registers in an external collar, and the reuse of the input data register of the LBRAM to capture data output from the LBRAM in the LBRAM scan chain.

Compared to built-in self-test (BIST) schemes, the modified LBRAM of present invention provides a reduction in total memory area of an integrated circuit die, typically 40 percent. In an average design, the memory area uses about 23 percent to 32 percent of the total die area, therefore a 40 percent reduction in memory area will result in an average reduction in total die area of about 13 percent and a corresponding decrease in silicon production costs.

Another advantage of the modified LBRAM of present invention is the reduction in test time compared to the use of scannable latches and traditional testing methods. For a typical design with 300 LBRAMs and a 20 MHz tester that supports 20 scan chains, the LBRAM scan chains will average about 1150 flops in length. Since all LBRAMs are typically tested in parallel, the number of test patterns is usually independent of the number of LBRAMs, and only depends on the number of words of the largest LBRAM. If the largest LBRAM has 128 words, the LBRAM scan test requires about 500 test patterns, so the test time is about 30 milliseconds. In traditional testing methods, the scan test must use all of the logic chains at once, averaging about 10000 flops in length for a typical design. The corresponding test time is about 250 milliseconds for the LBRAM.

In another aspect of the present invention, a method of scan testing a latch based random access memory in an integrated circuit die comprising steps of:

(a) modifying a latch based memory to include a latch array bypass multiplexer for selecting one of an output of an input data buffer of the latch based random access memory and an output of a latch array of the latch based random access memory for generating a first data output of the latch based random access memory from the input data buffer during logic scan testing and a second data output of the latch based random access memory from the latch array during memory scan testing in response to a memory scan mode signal;

(b) asserting the memory scan mode signal during a memory scan test; and (c) removing the memory scan mode signal during a logic scan test.

Figure 6:
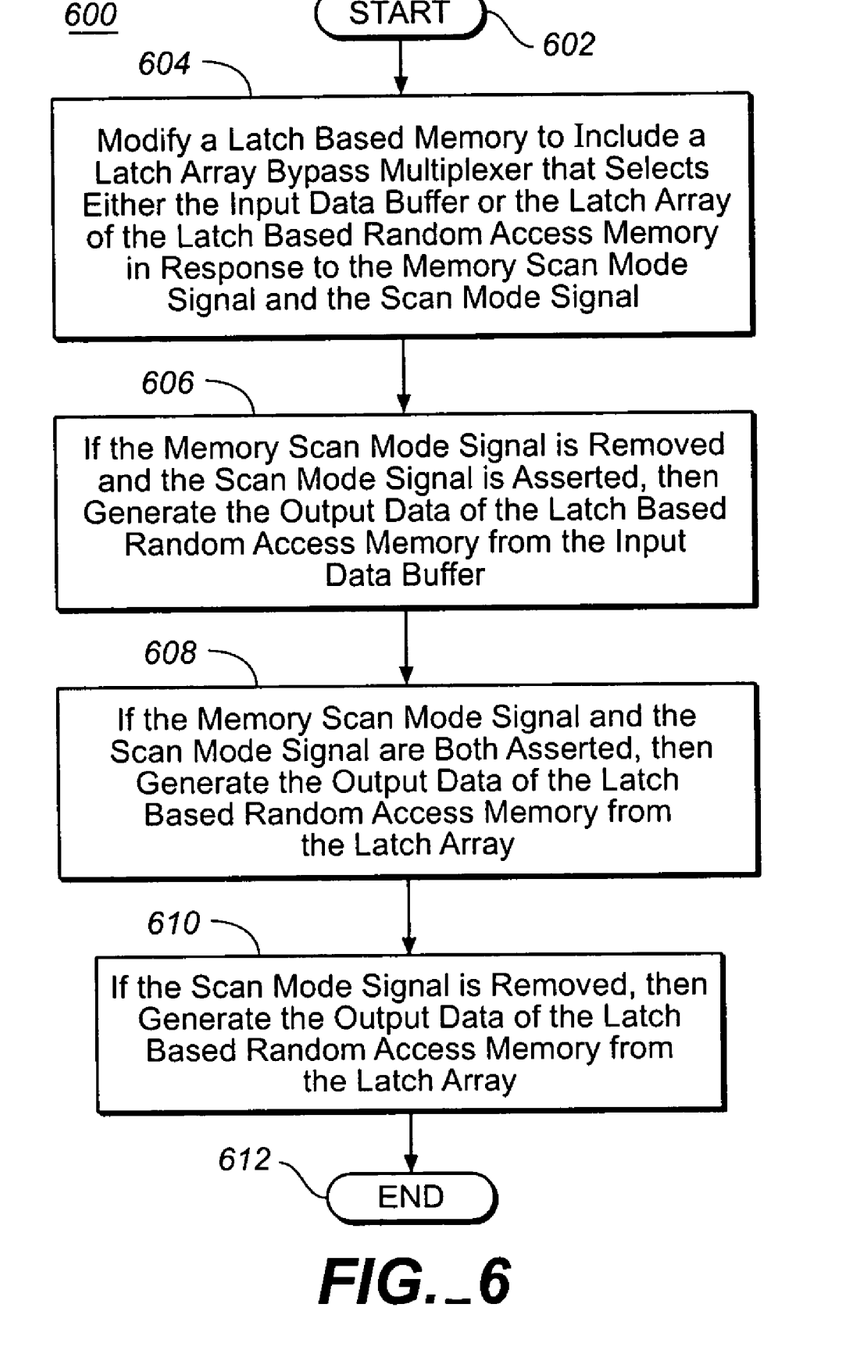
FIG. 6 illustrates a flow chart of a method of scan testing a latch based random access memory in an integrated circuit die according to an embodiment of the present invention.

FIG. 6 illustrates a flow chart 600 of a method of scan testing a latch based random access memory in an integrated circuit die according to an embodiment of the present invention.

Step 602 is the entry point of the flow chart 600.

In step 604, a latch based memory is modified as described above to include a latch array bypass multiplexer 108. The latch array bypass multiplexer 108 selects either the input data buffer 124 or the latch array 130 of the latch based random access memory in response to the memory scan mode signal 134 and the scan mode signal 140.

In step 606, if the memory scan mode signal 134 is removed and the scan mode signal 140 is asserted, then the latch array bypass multiplexer 108 generates output data from the input data buffer 124.

In step 608, if the memory scan mode signal 134 and the scan mode signal 140 are both asserted, then the latch array bypass multiplexer 108 generates output data from the latch array 130.

In step 610, if the scan mode signal 140 is removed, then the latch array bypass multiplexer 108 generates output data from the latch array 130.

Step 612 is the exit point of the flow chart 600.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations may be made thereto by those skilled in the art without departing from the scope of the invention set forth in the following claims.

What is claimed is:

1. A latch based random access memory comprising:
an input data register;
an input data buffer coupled to the input data register;
a latch array coupled to the input data buffer; and
a latch array bypass multiplexer for selecting one of the input data buffer and the latch array to generate a first data output of the latch based random access memory from the input data buffer during logic scan testing and a second data output of the latch based random access memory from the latch array during memory scan testing in response to a memory scan mode signal.

2. The latch based random access memory of claim 1 further comprising:
a read address register; and
a read address multiplexer coupled to the read address register for selecting one of a logic scan address and a memory scan address in response to the memory scan mode signal.

3. The latch based random access memory of claim 2 further comprising:
a write enable register; and
a clock signal multiplexer coupled to the read address register and the write enable register for selecting one of a scan test clock signal and an application specific clock signal in response to a scan mode signal.

4. The latch based random access memory of claim 3 further comprising bypass logic for controlling the latch array bypass multiplexer in response to the memory scan mode signal and the scan mode signal.

5. The latch based random access memory of claim 3 further comprising a lockup latch coupled to the read address register for providing a minimum hold time for the write enable register during scan testing of the latch based random access memory.

6. The latch based random access memory of claim 2 further comprising a lockup latch coupled to the input data register for providing a minimum hold time during scan testing of the latch based random access memory.

7. A method of scan testing a latch based random access memory in an integrated circuit die comprising steps of:

(a) modifying a latch based memory to include a latch array bypass multiplexer for selecting one of an input data buffer of the latch based random access memory and a latch array of the latch based random access memory for generating a first data output of the latch based random access memory from the input data buffer during logic scan testing and a second data output of the latch based random access memory from the latch array during memory scan testing in response to a memory scan mode signal;

(b) asserting the memory scan mode signal during a memory scan test; and (c) removing the memory scan mode signal during a logic scan test.

8. The method of claim 7 further comprising a step of selecting one of a logic scan address and a memory scan address for coupling to a read address register of the latch based random access memory in response to the memory scan mode signal.

9. The method of claim 8 further comprising a step of selecting one of a scan test clock signal and an application-specific clock signal for coupling to the read address register and a write address register of the latch based random access memory in response to a scan mode signal.

10. The method of claim 9 further comprising a step of controlling the latch array bypass multiplexer in response to the scan mode signal.

11. The method of claim 7 further comprising a step of providing a minimum hold time during scan testing of the latch based random access memory.

12. The method of claim 7 wherein step (b) further comprises bypassing logic chains surrounding the latch based random access memory during a memory scan test.

13. The method of claim 7 wherein step (c) further comprises bypassing the latch array during a logic scan test.

* * * * *